United States Patent [19]

Austin et al.

[11] Patent Number: 5,151,619
[45] Date of Patent: Sep. 29, 1992

[54] CMOS OFF CHIP DRIVER CIRCUIT

[75] Inventors: John S. Austin, Essex Junction; Ronald A. Piro, South Burlington; Douglas W. Stout, Milton, all of Vt.

[73] Assignee: International Business Machines Corporation, Armonk, N.Y.

[21] Appl. No.: 595,911

[22] Filed: Oct. 11, 1990

[51] Int. Cl.$^5$ ............... H03K 19/017; H03K 19/096; H03K 17/687; H03K 17/04
[52] U.S. Cl. ................................ 307/473; 307/475; 307/270; 365/168
[58] Field of Search ............... 307/443, 448, 450, 451, 307/475, 270, 473, 572, 585; 365/168

[56] References Cited

U.S. PATENT DOCUMENTS

| | | | |
|---|---|---|---|
| 4,217,502 | 8/1980 | Suzuki et al. | 307/205 |
| 4,574,273 | 3/1986 | Atsumi et al. | 307/475 |
| 4,585,958 | 4/1986 | Chung et al. | 307/473 |
| 4,709,162 | 11/1987 | Braceras et al. | 307/475 X |
| 4,782,250 | 11/1988 | Adams et al. | 307/473 |
| 4,963,766 | 10/1990 | Lundberg | 307/473 X |

OTHER PUBLICATIONS

System Process and Design Implications of a Reduced Supply Voltage Microprocessor by R. Allmon et al. in the 1990 IEEE International Solid-State Circuits Conference, pp. 48 and 49, Feb. 14, 1990.

Primary Examiner—Edward P. Westin
Assistant Examiner—David R. Bertelson
Attorney, Agent, or Firm—J. Dennis Moore; Stephen J. Limanek

[57] ABSTRACT

A CMOS off-chip driver circuit is provided which includes a P-channel pull up transistor and an N-channel pull down transistor serially arranged between a first voltage source having a supply voltage of a given magnitude and ground with the common point between the transistors forming an output terminal to which is connected a circuit including a second voltage source having a supply voltage of a magnitude significantly greater than that of the given magnitude. A first P-channel field effect transistor is connected between the output terminal and the gate electrode of the pull up transistor. A first input terminal is coupled to the gate electrode of the pull up transistor through a transmission gate including a first N-channel field effect transistor arranged in parallel with a second P-channel field effect transistor, with a gate electrode of the first N-channel transistor being connected to the first voltage source and the gate electrode of the second P-channel transistor being connected to the output terminal.

9 Claims, 1 Drawing Sheet

CMOS OFF CHIP DRIVER CIRCUIT

DESCRIPTION

1. Technical Field

This invention relates to off-chip driver circuits and, more particularly, to a complementary metal oxide semiconductor (CMOS) off-chip driver circuit which is part of a system wherein the off-chip driver circuit is designed in a lower supply voltage environment than is the circuit to which the output of the off-chip driver circuit is connected.

2. Background Art

Reduced scaling or shrinking of the geometries of devices used in integrated semiconductor circuit technology for forming denser circuits has required voltage supply sources to provide lower voltages than the heretofore generally accepted standard supply voltage of 5 volts so as to avoid a voltage breakdown in the smaller devices. During the transition from 5 volt supplies to the lower voltage supplies of, say, 3.3 to 3.6 volts, a mix of circuits is being used wherein some of the circuits have been designed for use with standard 5 volt supplies while other circuits have been designed for use with the lower 3.3 to 3.6 volt supplies. In general, the geometries of memory circuits are reduced at a faster rate than are the geometries of logic circuits which are coupled to the memory circuits. In particular, CMOS random access memories are currently being designed in about 3.3 to 3.6 volt supply technology, whereas logic circuits, such as those of transistor-transistor logic (TTL) type, which receive the output signals or data from the memories, are still being designed in a 5 volt supply technology. With these low voltage memory circuits feeding into the high voltage logic circuits through off-chip drivers excessive voltage stress is encountered in the thin insulation or oxide layers of some of the devices in the off-chip drivers which form the interface between the memory and logic circuits, and, furthermore, undesirable current leakage paths are created therein resulting in a power loss and also, at times, in serious CMOS latch up problems.

In U.S. Pat. No. 4,585,958, filed Dec. 30, 1983, there is disclosed a CMOS driver circuit having a P-channel pull up device and an N-channel pull down device with a NAND circuit and a NOR circuit connected to the gate electrodes of the pull up and pull down devices, respectively.

U.S. Pat. No. 4,217,502, filed Sep. 11, 1978, discloses a circuit similar to that of the hereinabove identified U.S. Pat. No. 4,585,958 but additionally provides voltage control of the P-channel transistor substrate.

U.S. Pat. No. 4,574,273, filed Nov. 4, 1983, discloses a voltage converter circuit which uses two power supply voltages, one at +5 volts and another at +21 volts.

Commonly assigned U.S. Pat. No. 4,782,250, filed Aug. 31, 1987, by R. D. Adams, R. C. Flaker, K. S. Gray and H. L. Kalter, discloses a CMOS off-chip driver circuit which interfaces between a first circuit with a given supply voltage and a second circuit with a supply voltage having a magnitude greater than that of the given supply voltage without producing excessive voltage stress on insulation or oxide layers in any of the devices of the circuits and with very little current leakage, particularly into the semiconductor substrate to avoid CMOS latch up problems.

DISCLOSURE OF THE INVENTION

It is an object of this invention to provide an improved CMOS off-chip driver circuit, having higher performance and higher density of devices, which interfaces between a first circuit with a given supply voltage and a second circuit with a supply voltage having a magnitude greater than that of the given supply voltage without producing an excessive voltage stress on insulation or oxide layers in any of the devices of the circuits and with minimum or no current leakage paths.

In accordance with the teachings of this invention, a CMOS off-chip driver circuit is provided which includes a first P-channel field effect transistor acting as a pull up transistor and a first N-channel field effect transistor acting as a pull down transistor serially arranged between a first voltage source having a supply voltage of a given magnitude and a point of reference potential, such as ground, with the common point between these transistors forming a data output terminal to which is connected a circuit including a second voltage source having a supply voltage of a magnitude significantly greater than that of the given magnitude. A second P-channel field effect transistor is connected between the data output terminal and the control or gate electrode of the first P-channel transistor. A first input terminal is coupled to the control or gate electrode of the first P-channel transistor through a transmission gate including a third P-channel field effect transistor arranged in parallel with a second N-channel field effect transistor, with the control or gate electrode of the third P-channel transistor being connected to the data output terminal and the control or gate electrode of the second N-channel transistor being connected to the first voltage source. A second input terminal is connected to the gate electrode of the first N-channel transistor. Means are also provided to appropriately bias the substrate of the first, second and third P-channel transistors.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
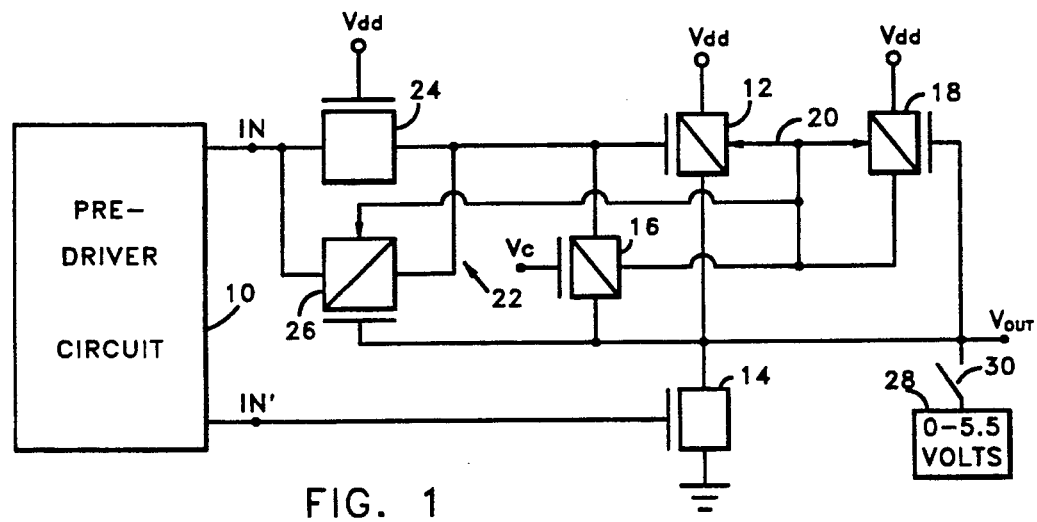
FIG. 1 is primarily a circuit diagram of a preferred embodiment of the present invention.

Referring to FIG. 1 of the drawings in more detail, there is shown a circuit diagram of a preferred embodiment of the CMOS off-chip driver circuit of the present invention connected to any suitable, known pre-driver circuit indicated by block 10 which may be of the type illustrated and described in the hereinabove identified commonly assigned U.S. Pat. No. 4,782,250. The driver circuit, being made in the CMOS technology, has its P-channel field effect transistors indicated by a rectangle with a diagonal line formed therein and a gate electrode arranged adjacent thereto and its N-channel field effect transistors indicated by a rectangle without a diagonal line and a gate electrode arranged adjacent thereto.

The CMOS off-chip driver circuit of the present invention illustrated in FIG. 1 includes first and second input terminals IN and IN', respectively, connected to the pre-driver circuit 10, and a first P-channel field effect transistor 12 acting as a pull up transistor and a first N-channel field effect transistor 14 acting as a pull down transistor serially arranged between a first voltage source Vdd having a supply voltage of a given magnitude, such as 3.6 volts, and a point of reference potential, such as ground. The common point between the serially arranged transistors 12 and 14 forms a data output terminal Vout. The gate electrode of the first N-channel transistor is connected to the second input terminal IN'. A second P-channel field effect transistor 16 acting as a control transistor is connected between the output terminal Vout and the gate electrode of the first P-channel transistor 12 with its gate electrode connected to a reference voltage Vc which has a magnitude preferably equal to or less than the supply voltage of the first voltage source Vdd and equal to or greater than the supply voltage of the first voltage source Vdd minus the threshold voltage Vt of the P-channel transistor 12. It can be seen that it is convenient to have the voltage Vc be made equal to that of the first voltage source Vdd. A third P-channel field effect transistor 18 acting as an N-well bias transistor is connected between the first voltage source Vdd and a common N-well 20 with its gate electrode being connected to the data output terminal Vout. The P-channel pull up transistor 12, control transistor 16 and N-well bias transistor 18 are all disposed in the common N-well 20, as can be seen more readily in FIG. 2 of the drawings, which will be discussed hereinbelow in more detail.

A transmission gate 22 is connected between the first input terminal IN and the gate electrode of the pull up transistor 12. The transmission gate 22 includes a second N-channel field effect transistor 24 having its gate electrode connected to a point of reference potential, preferably the supply voltage of the first voltage source Vdd, and a fourth P-channel field effect transistor 26 connected in parallel with the second N-channel transistor 24 having its gate electrode connected to the data output terminal Vout.

An external circuit or system, which may be a transistor-transistor logic (TTL) circuit having a second voltage source, sometimes known as VH, with a supply voltage of about 5 volts, indicated by block 28, is selectively connectable by any appropriate means, such switching means 30, to the data output terminal Vout. The external circuit or system 28 is generally formed on a separate semiconductor chip and may have voltages which range from about 0 to 5.5 volts.

Figure 2:
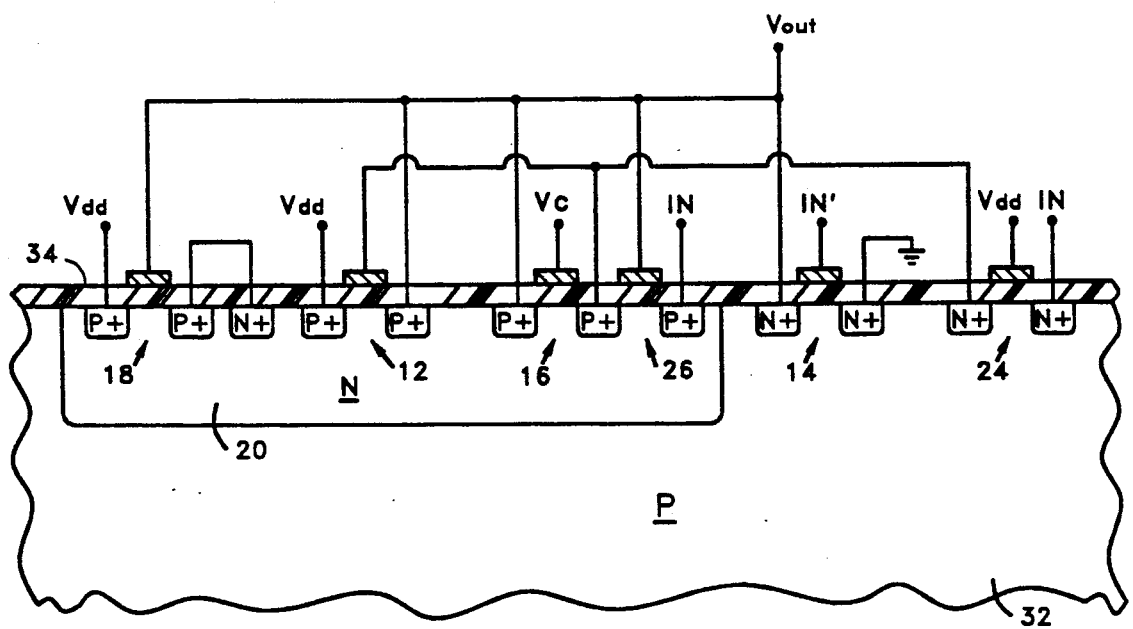
FIG. 2 is a sectional view taken through a semiconductor substrate of the P-channel and N-channel field effect transistors of the circuit illustrated in FIG. 1.

Referring to FIG. 2 of the drawings in more detail, wherein similar elements have like reference numerals or characters to those indicated in FIG. 1, there is shown in cross-sectional view through a P-type semiconductor substrate 32, preferably made of silicon, the P-channel transistors 12, 16, 18 and 26 disposed in the common N-well 20, with the N-channel transistors 14 and 24 being formed in the P-type substrate 32. A gate oxide 34, preferably a thin layer of silicon dioxide, is grown on the surface of the substrate 32 to separate the gate electrodes of the transistors, i.e., transistors 12, 14, 16, 18, 24 and 26, from the surface of the substrate 32. As is known, the sources and drains of the P-channel transistors may be made by using diffusion or ion implantation techniques with, e.g., boron as the impurity, to form the P+ regions in the common N-well 20, and the sources and drains of the N-channel transistors may be made by using these techniques with arsenic or phosphorous impurities to form the N+ regions in the P-type semiconductor substrate 32. A contact to the common N-well 20 is made by forming an N+ region in the N-well.

In the operation of the CMOS off-chip driver circuit of the present invention illustrated in FIGS. 1 and 2 of the drawings, to apply binary digit information, i.e., a 0 or a 1, which is indicated by, say, 0 or 3.6 volts, respectively, to the data output terminal Vout, voltages 0 or 3.6 volts are supplied by the pre-driver circuit 10 to the input terminals IN and IN' to control the pull up and pull down transistors 12 and 14, respectively. As is known, if the voltage at the gate electrode of the P-channel transistor 12 is low, i.e., at 0 volts, and the voltage at the gate electrode of the N-channel transistor 14 is also low, output terminal Vout will be at a high voltage of 3.6 volts. If the voltage at the gate electrode of the P-channel transistor 12 is high, i.e., at 3.6 volts, and the voltage at the gate electrode of the N-channel transistor 14 is also high, output terminal Vout will be at a low voltage of approximately 0 volts.

If the voltage at the gate electrode of the P-channel transistor 12 is high, i.e., at 3.6 volts, and the voltage at the gate electrode of the N-channel transistor 14 is low, i.e., at 0 volts, then the output is in a high impedance state and the driver circuit is said to be disabled. In this condition, voltages from the external circuit 28 which may have a magnitude of from 0 to 5.5 volts can be applied to the output terminal Vout with the closing of the switching means 30.

With the driver circuit disabled, when the voltage applied to the output terminal Vout rises to a threshold voltage above the voltage Vc, the P-channel transistor 16 turns on allowing the voltage at the gate electrode of the first P-channel transistor 12 to rise to the voltage at the output terminal Vout. Forward biasing of the source-to-N-well junction of the P-channel transistor 16 causes current to flow into the N-well 20 and the floating N-well voltage consequently rises to the voltage at the output terminal Vout minus the base-emitter drop in the parasitic pnp transistor which is formed in the N-well 20. The P-channel transistor 12, which is also tied to the floating substrate or N-well 20, will now have a positive potential between its gate electrode and source, maintaining transistor 12 in the off condition to prevent current flow into the voltage source Vdd. Also, since the voltage at the gate electrode of the first P-channel transistor 12 is greater than the supply voltage of the voltage source Vdd minus a threshold voltage of the second N-channel transistor 24, transistor 24 turns off to prevent current flow into the pre-driver circuit 10. Of course, since the voltage at the output terminal Vout is high, the fourth P-channel transistor 26 of the transmission gate 22 will also be turned off.

It should be noted that without the use of the P-channel transistor 26 in the transmission gate 22 a high voltage of, say, 3.6 volts, at the input terminal IN would not provide 3.6 volts at the gate electrode of the P-channel transistor 12 due to the threshold voltage drop in the N-channel transistor 24. By providing the transmission gate 22 which includes the P-channel transistor 26 with its gate electrode connected to the output terminal Vout and the N-channel transistor 24 with its gate electrode connected to the voltage source Vdd, a rail-to-rail voltage swing is provided which readily turns off the pull up transistor 12 to prevent current leakage into the voltage source Vdd when the voltage at the output terminal Vout is less than the supply voltage of the first voltage source Vdd plus the absolute value of the threshold voltage of the P-channel transistor 16.

In another embodiment of this invention, the driver circuit illustrated in FIGS. 1 and 2 of the drawings may be modified by eliminating the fourth P-channel transistor 26 of the transmission gate 22 and designing the transistors so that the supply voltage of the voltage source Vdd minus the threshold voltage of the N-channel transistor 24 is greater than the supply voltage of the voltage source Vdd minus the absolute value of the threshold voltage of the P-channel transistor 16 so as to pull the voltage at the gate electrode of the P-channel transistor 12 high enough to turn off the transistor 12.

It can be seen that since in accordance with the teachings of this invention the pull up transistor 12 blocks flowback current, it is not necessary to use a stacked transistor arrangement as taught in the above identified U.S. Pat. No. 4,782,250. Eliminating stacked transistors in an output stage saves a considerable amount of area on a chip or substrate since output transistors generally must be large to provide desired output currents. When output transistors must be stacked they must be made even larger than normal to reduce the impact of the series impedance caused by the stacking. Furthermore, eliminating the stacking improves the performance of the driver circuit without providing unduly large output transistors.

Thus, it should be noted that this invention provides a passgate between the pre-driver circuit 10 and the pull up transistor 12 in order to eliminate the need for disabling two of the P-channel transistors used in the prior art circuits, allowing implementation of logic controlled drivers without duplication of transistors. Also, in this invention the pull up transistor 12 is turned off to prevent current flow into the first voltage source Vdd when a high voltage greater than a threshold voltage above the supply voltage Vdd is applied to the output terminal Vout, whereas in the prior art a second stacked transistor was required to prevent such current flow into the voltage source Vdd. Furthermore, the second stacked transistor of the prior art circuit requires a number of control transistors for typically data and enable inputs. In instances where logic circuits require that the second stacked transistor have additional transistors connected in parallel therewith, each of the additional transistors would require a number of control transistors, as disclosed more fully in, e.g., IBM Technical Disclosure Bulletin, Vol. 33, No. 3A, August 1990, in an article entitled "Performance-Controlled CMOS Driver for Multi-Voltage Interfaces" by R. A. Piro. Accordingly, it can be seen that the driver circuit of the present invention can be operated with many fewer transistors and it does not require very large output transistors as pull up and pull down transistors, thus, resulting in the use of a significantly smaller substrate or chip area.

In the present invention, it should be noted, that the pull up transistor is used to block flowback current into the first voltage source Vdd without the need for a second stacked transistor as used in the prior art, and where stacked transistors are required for logic purposes the associated control transistors are not needed.

This invention further allows a driver circuit not originally designed to operate with higher voltage networks to be converted for use with such networks with relative ease by simply adding three or four transistors, such as transistors 16, 18, 24 and 26 into a non-interfacing driver circuit.

It should be noted that in accordance with the teachings of this invention, the CMOS off-chip driver circuit may also be formed in an N-type semiconductor substrate with the well being of the P-well type with all polarities reversed.

Accordingly, an improved off-chip driver circuit for interface to higher voltage networks or circuits has been provided by the present invention which uses fewer transistors to eliminate current leakage, has superior performance and requires a smaller surface area on a substrate or chip.

While the invention has been particularly shown and described with reference to preferred embodiments thereof, it will be understood by those skilled in the art that various changes in form and details may be made therein without departing from the spirit and scope of the invention.

What is claimed is:

1. An off-chip driver circuit comprising
a pull up transistor,
an output terminal,
voltage source means for providing a supply voltage of a given magnitude, said pull up transistor being disposed between said voltage source means and said output terminal,
a control transistor connected between a gate electrode of said pull up transistor and said output terminal having a gate electrode connected to a given point of reference potential,
a passgate including an N-channel field effect transistor having a gate electrode connected to a fixed point of reference potential and a first P-channel field effect transistor connected in parallel with said N-channel field effect transistor and having a gate electrode connected to said output terminal,
pre-driver circuit means for supplying a data in signal coupled to the gate electrode of said pull up transistor through said passgate, and
means for selectively applying a voltage to said output terminal having a magnitude significantly greater than that of said given magnitude.

2. An off-chip driver circuit as set forth in claim 1 wherein said given point of reference potential is substantially said supply voltage.

3. An off-chip driver circuit as set forth in claim 1 wherein said fixed point of reference potential is said supply voltage.

4. An off-chip driver circuit as set forth in claim 1 further including
a semiconductor substrate including an N-well supporting said transistors and
means including a second P-channel field effect transistor for biasing said N-well having a gate electrode coupled to said output terminal.

5. An off-chip driver circuit as set forth in claim 1 wherein said pull up transistor and said control transistor are P-channel field effect transistors.

6. An off-chip driver circuit comprising
a pull up transistor,
a pull down transistor,
voltage source means for providing a supply voltage of a given magnitude, said pull up transistor and said pull down transistor being serially connected between said voltage source means and a point of reference potential, an output terminal connected to a common point between said transistors, a control transistor connected between a gate electrode of said pull up transistor and said output terminal having a gate electrode connected to a point of reference potential having a voltage magnitude equal to about that of said given magnitude, a transmission gate including an N-channel field effect transistor having a gate electrode connected to said supply voltage and a P-channel field effect transistor having a gate electrode connected to said output terminal, pre-driver circuit means for supplying data in signals coupled to the gate electrode of said pull up transistor through said transmission gate and to a gate electrode of said pull down transistor, and means for selectively applying a voltage to said output terminal having a magnitude significantly greater than that of said given magnitude.

7. An off-chip driver circuit as set forth in claim 6 wherein said pull up transistor and said control transistor are P-channel field effect transistors and said pull down transistor is a first N-channel field effect transistor.

8. A CMOS driver comprising
a first P-channel field effect transistor,
a first N-channel field effect transistor,
voltage source means for providing a supply voltage having a given magnitude, said first P-channel and said first N-channel transistors being serially connected between said voltage source means and a point of reference potential, an output terminal connected to a common point between said first P-channel transistor and said first N-channel transistor, a second P-channel field effect transistor connected between a gate electrode of said first P-channel transistor and said output terminal, first and second input terminals, said first input terminal being coupled to a gate electrode of said first N-channel transistor, means for applying data in signals to said first and second input terminals, a second N-channel field effect transistor coupling said second input terminal to the gate electrode of said first P-channel transistor, gate electrodes of said second N-channel transistor and said second P-channel transistor being connected to points of fixed potential, a third P-channel field effect transistor connected in parallel with said second N-channel transistor having a gate electrode connected to said output terminal, and means for selectively applying a voltage to said output terminal having a magnitude greater than that of said given magnitude.

9. A CMOS driver as set forth in claim 8 wherein said fixed potential is a voltage of approximately said given magnitude.

* * * * *